US005635240A

United States Patent [19]
Haluska et al.

[11] Patent Number: 5,635,240
[45] Date of Patent: Jun. 3, 1997

[54] ELECTRONIC COATING MATERIALS USING MIXED POLYMERS

[75] Inventors: Loren A. Haluska; Keith W. Michael, both of Midland, Mich.

[73] Assignee: Dow Corning Corporation, Midland, Mich.

[21] Appl. No.: 491,734

[22] Filed: Jun. 19, 1995

[51] Int. Cl.$^6$ ............................................. B05D 1/12
[52] U.S. Cl. ...................... 427/180; 427/228; 427/376.2; 427/376.3; 427/377
[58] Field of Search ........................ 427/180, 228, 427/376.2, 376.3, 377

[56] References Cited

U.S. PATENT DOCUMENTS

| | | | |
|---|---|---|---|
| 4,756,977 | 7/1988 | Haluska et al. | 428/704 |
| 4,847,162 | 7/1989 | Haluska et al. | 428/457 |
| 5,358,739 | 10/1994 | Baney et al. | 427/226 |
| 5,436,084 | 7/1995 | Haluska et al. | 428/688 |

FOREIGN PATENT DOCUMENTS

WO93/02472  2/1993  WIPO ........................ H01L 21/312

*Primary Examiner*—Benjamin Utech
*Attorney, Agent, or Firm*—Roger E. Gobrogge; Sharon K. Severance

[57] ABSTRACT

The present invention relates to a method of forming coatings on electronic substrates and the substrates coated thereby. The method comprises applying a coating comprising hydrogen silsesquioxane resin and a polysilazane on a substrate and heating the coated substrate at a temperature sufficient to convert the resins to ceramics.

7 Claims, No Drawings

ELECTRONIC COATING MATERIALS USING MIXED POLYMERS

BACKGROUND OF THE INVENTION

The present invention relates to a method of forming coatings on electronic substrates using mixtures of hydrogen silsesquioxane resin and polysilazanes. These combinations provide coatings with unique properties and characteristics.

The use of hydrogen silsesquioxane derived ceramic coatings on substrates such as electronic devices is known in the art. For instance, Haluska et al. in U.S. Pat. No. 4,756,977 disclose a process for forming a silica coating on an electronic substrate wherein a solution of hydrogen silsesquioxane resin is applied to a substrate followed by heating the coated substrate in air at a temperature in the range of 200°–1000° C. This reference, however, does not describe using a mixture of resins to form the coating.

Similarly, the use of polysilazanes to form ceramic coatings on electronic devices is known in the art. For instance, International Publication WO 93/02472 and U.S. Pat. No. 5,358,739 teach processes for forming coatings on electronic substrates wherein polysilazane resins are applied to electronic substrates followed by heating the coated substrates to convert the polysilazanes into ceramics. These references, too, do not describe using a mixture of polymers.

The present inventors have now discovered that useful coatings can be formed from mixture of hydrogen silsesquioxane resin and polysilazanes.

SUMMARY OF THE INVENTION

The present invention relates to a method of forming a coating on an electronic substrate and the substrates coated thereby. The method comprises first applying a composition comprising between about 10 and about 90 wt. % hydrogen silsesquioxane resin and between about 90 and about 10 wt. % polysilazane on the substrate. The coated substrate is then heated at a temperature sufficient to convert the composition to a ceramic coating.

The present invention also relates to the coating composition comprising between about 10 and about 90 wt. % hydrogen silsesquioxane resin and between about 90 and about 10 wt. % polysilazane diluted in a solvent used to form the coatings.

DETAILED DESCRIPTION OF THE INVENTION

The present invention is based on the discovery that desirable coatings can be formed from a composition comprising hydrogen silsesquioxane resin and a polysilazane. Coatings derived therefrom can be thicker (eg., >1 micrometer) than those derived from hydrogen silsesquioxane resin and they can be crack and pore-free.

Because of the above advantages, these coatings are particularly valuable on electronic substrates. Such coatings could serve, for example, as protective coatings, dielectric coatings, interlevel dielectric layers and the like.

As used in the present invention, the expression "ceramic coating" is used to describe the hard coating obtained after heating the hydrogen silsesquioxane-polysilazane composition. This coating contains amorphous silica ($SiO_2$) materials as well as amorphous silica-like materials that are not fully free of residual carbon, silanol (Si—OH), nitrogen (Si—N) and/or hydrogen. The expression "electronic substrate" is meant to include, but is not limited to, electronic devices or electronic circuits such as silicon based devices, gallium arsenide based devices, focal plane arrays, optoelectronic devices, photovoltaic cells and optical devices.

In the process of the present invention a ceramic coating is formed on an electronic substrate by a process which comprises applying a coating composition comprising hydrogen silsesquioxane resin and a polysilazane onto the substrate and then heating the coated substrate at a temperature sufficient to convert the composition to a ceramic.

The hydrogen silsesquioxane resins (H-resin) which may be used in this invention include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, x=0–2, y=0–2, z=1–3, x+y+z=3. Examples of R include alkyls such as methyl, ethyl, propyl, butyl, etc., aryls such as phenyl, and alkenyls such as allyl or vinyl. As such, these resins may be fully condensed $(HSiO_{3/2})_n$ or they may be only partially hydrolyzed (i.e., containing some Si—OR) and/or partially condensed (i.e., containing some Si-OH). Although not represented by this structure, these resins may contain a small number (eg., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

The polysilazanes (or silazane polymers) useful in this invention are generally well known in the art and their structure is not particularly critical. The polysilazanes of this invention generally contain units of the type $[R_2SiNH]$, $[RSi(NH)_{1.5}]$ and/or $[R_3Si(NH)_{1/2}]$ wherein each R is independently selected from the group consisting of hydrogen, alkyl radicals containing 1 to 20 carbon atoms, aryl radicals, and alkenyl radicals. Naturally, the polysilazanes useful in this invention may contain other silazane units. Examples of such units include $[MeSi(NH)_{1.5}]$, $[Me_2SiNH]$, $[ViSi(NH)_{1.5}]$, $[Vi_2SiNH]$, $[PhMeSiNH]$, $[PhViSiNH]$, $[MeViSiNH]$, $[HSi(NH)_{1.5}]$, $[H_2SiNH]$, and the like. Mixtures of polysilazanes may also be employed in the practice of this invention.

The polysilazanes of this invention can be prepared by techniques well known in the art. The actual method used to prepare the polysilazane is not critical. Suitable preceramic silazane polymers or polysilazanes may be prepared by the methods of Cannady in U.S. Pat. No. 4,540,803 (issued Sep. 10, 1985) and U.S. Pat. No. 4,543,344 (issued Sep. 24, 1985) which are hereby incorporated by reference. Other polysilazanes suitable for use in this invention can be prepared by the methods of Gaul in U.S. Pat. No. 4,312,970 (issued Jan. 26, 1982), U.S. Pat. No. 4,340,619 (issued Jul. 20, 1982), U.S. Pat. No. 4,395,460 (issued Jul. 26, 1983), and U.S. Pat. No. 4,404,153 (issued Sep. 13, 1983), all of which are hereby incorporated by reference. Suitable polysilazanes also include those prepared by the methods of Haluska in U.S. Patent No. 4,482,689 (issued Nov. 13, 1984) and Seyferth et al. in U.S. Pat. No. 4,397,828 (issued Aug. 9, 1983), both of which are hereby incorporated by reference. Still other polysilazanes include those of U.S. Pat. No. 5,075,266 those of U.S. Pat. No. 4,543,344, those of U.S. Pat. No. 5,151,390, those of Lebrun et al. in U.S. Pat. Nos. 4,656,300 and 4,689,252 and those of Funayama et al. in U.S. Pat. No. 5,030,744, the disclosures of which are all hereby incorporated by reference.

Especially preferred polysilazanes are those which have no carbon in the repeating units of the polymer since the resultant coatings have little carbon contamination. End blocking groups such as $Me_3Si(NH)_{1/2}$ are acceptable in such polymers since they are generally removed during the subsequent pyrolysis steps.

The most preferred polymers to be used herein are those of Gaul in U.S. Pat. No. 4,340,619 and those of Cannady in U.S. Pat. No. 4,540,803. The silazane polymers of Gaul are prepared by contacting and reacting in an inert, essentially anhydrous atmosphere a chlorine containing disilane or mixture of chlorine containing disilanes of the general formula $(Cl_xR_ySi)_2$ with a disilazane having the general formula $(R_3'Si)_2NH$ at a temperature in the range of 25° C. to 300° C. while distilling volatile byproducts, wherein R is vinyl, an alkyl group of 1–3 carbon atoms or a phenyl group; R' is vinyl, hydrogen an alkyl group of 1–3 carbon atoms or a phenyl group; x has a value of 0.5–3; y has a value of 0–2.5 and the sum of x+y equals 3. An especially preferred embodiment of the Gaul invention involves the reaction of methylchlorodisilanes with hexamethyldisilazane to produce methylpolydisilylazane. The silazane polymers of Gaul may have a relatively high chloride ion content and it is preferred that such concentration be lowered before use in the present invention. A method for such removal is described in U.S. Pat. No. 4,772,516 granted to Mahone, which is hereby incorporated by reference. The method described therein comprises treating the polymer with ammonia for a time sufficient to remove the chlorine.

The silazane polymers of Cannady are prepared by a method which comprises contacting and reacting in an inert essentially anhydrous atmosphere, trichlorosilane with a disilazane at a temperature in the range of 25° C. to 300° C. while distilling volatile byproducts. The disilazane used in the process has the formula $(R_3Si)_2NH$ where R is selected from the group consisting of vinyl, hydrogen, phenyl and alkyl radicals containing 1 to 3 carbon atoms. An especially preferred embodiment of the Cannady invention involves the reaction of trichlorosilane with hexamethyldisilazane to produce hydridopolysilazane.

In addition, polysilazanes doped with boron (i.e., polyborosilazanes or borosilazanes) are also within the scope of the present invention and included in the definition of polysilazanes. These borosilazanes are also generally well known in the art and their structure is not particularly critical. The boron content of these polymers is likewise generally not critical and, thus, can vary over a wide range (eg., 0.1–50 wt %). Generally, the backbone of the borosilazanes of this invention contain Si—B, Si—N, and B—N bonds with the remaining valences of these atoms filed by groups independently selected from the group consisting of hydrogen, alkyl radicals containing 1 to 20 carbon atoms such as methyl, ethyl, propyl, etc., aryl radicals such as phenyl, and alkenyl radicals such as vinyl. Preferred borosilazanes are those in which there is no carbon in the repeating units of the polymer, i.e., there may be carbon in the polymeric endcaps.

Examples of specific borosilazanes include, for instance, those described in U.S. Pat. No. 4,910,173 granted to Niebylski, those described in U.S. Pat. No. 5,169,908 granted to Zank, those described in U.S. Pat. No. 5,171,736 , those described by Haluska in U.S. Pat. No. 4,482,689, those described in U.S. Pat. No. 5,162,558, those described by Funayama et al. in U.S. Pat. No. 5,030,744, those described by Takamizawa et al. in U.S. Pat. No. 4,604,367, all of which are incorporated herein by reference in their entirety.

The method for preparing such compounds is likewise known in the art and described in the above references. Examples of such methods, however, comprises (1) reacting a boron trihalide with a silazane oligomer such as $(RSi(NH)_{1.5})_x$ or $((CH_3)_3Si)_2NH$, wherein R is selected from the group consisting of hydrogen, a hydrocarbon radical and a substituted hydrocarbon radical and x is an integer of 2–20; (2) reacting an organoborazine with an organopolysilane; and (3) the reaction of a boron compound such as a borane complex, boroxine, boron alkoxides, borazines, etc. with a polysilazane.

A particularly preferred polymer comprises the boron modified hydropolysilazane polymers of Zank in U.S. Pat. No. 5,169,908. These polymers are produced by a process which comprises reacting a hydrosilazane polymer with a borane complex or diborane. In a more preferred embodiment of the invention the hydropolysilazane used in the reaction of Zank is produced by the reaction of trichlorosilane and hexamethyldisilazane as described in U.S. Pat. No. 4,540,803.

If desired, other materials can also be added to the coating mixture. For instance, the coating composition may contain a platinum, rhodium or copper catalyst to increase the rate and extent of conversion of the resins to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of combined resins (hydrogen silsesquioxane resin and polysilazane).

It is also within the scope of the present invention to add particulate fillers to this mixture. These include, for example, various inorganic and organic fillers, especially inorganic fillers, in a variety of morphologies including, but not limited to powders, particles, flakes, microballoons, filaments (fibers) and the like. Examples of inorganic fillers include synthetic and natural materials such as the oxides, nitrides, borides and carbides of various metals and non-metals such as glass, alumina, silica, silicon monoxide, zirconium oxide, titanium dioxide, tantalum oxide, niobium oxide, zinc oxide, tungsten oxide, ruthenium oxide, silicon nitride, aluminum nitride, titanium diboride, silicon carbide, boron carbide and boron nitride; calcium carbonate; carbon, graphite, high dielectric constant fillers (eg >12) such as the titanate, niobate or tungstate salts of metals such as strontium, zirconium, barium, lead, lanthanium, iron, zinc, and magnesium including, for example, barium titanate, potassium titanate, lead niobate, lithium titanate, strontium titanate, barium strontium titanate, lead lanthanium zirconium titanate, lead zirconium titanate and lead tungstate; radiopaque materials (materials which prevent penetration by radiation) such as the insoluble salts of barium, lead, silver, gold, cadmium, antimony, tin, palladium, strontium, tungsten and bismuth including, for example, salts such as carbonates, sulfates and oxides (eg., barium sulfate); optically opaque fillers such as organic and inorganic pigments, silicon nitride powder, silicon carbide powder, aluminum nitride powder, silica, and alumina; tamperproof materials (materials which render heat on oxidation) such as magnesium, iron, tin, silicon and zinc; magnetic materials such as carbon alloys, ferrites, iron carbonyls and alloys of metals such as iron, manganese, cobalt, nickel, copper, titanium, tungsten, vanadium, molybdenum, magnesium, aluminum, chromium, zirconium, lead, silicon and zinc including, for example, $Fe_2O_3$, MnZn, NiZn, CuZn, and other ferrite materials; metals which produce thermally or electrically conductive coatings such as gold, silver, copper, aluminum, nickel, zinc, chromium, cobalt and the like; phosphors and the like. Also, some organic materials such as cellulose, polyamides, aramid, phenol resins and the like may be used.

The amount of any such filler used in the present invention can be varied over a wide range. Generally, however, the fillers are used in an amount less than about 90 volume percent to insure that enough resin is present to bind the filler. Obviously, smaller amounts of fillers (eg., 1–5 wt %) can also be used.

Still other materials which may be present in the coating composition include, for example, agents which modify the surface of the filler for better adhesion and suspending agents. The Adhesion promoters can include, for example, silanes such as glycidoxypropyltrimethoxysilane, mercaptopropyltrimethoxysilane, and vinyltriacetoxysilane. Generally, these are used in amounts of about 0.1 to about 5 wt. %. The suspending agents can include, for example, cellulose, clay, fumed silica, stearates and the like. These are used in amounts sufficient to suspend any fillers (eg., 1–25 wt. %). These and other optional components are known to those skilled in the art.

According to the process of the invention, the H-resin, polysilazane and any optional components are applied to the surface of a substrate. This can be accomplished in any manner, but a preferred method involves dissolving or dispersing the H-resin, polysilazane and any optional components in a solvent. This mixture is then applied to the surface of the substrate. Various facilitating measures such as stirring and/or heating may be used to dissolve or disperse the materials and create a more uniform application material. Solvents which may be used include any agent or mixture of agents which will dissolve or disperse the H-resin and polysilazane to form a homogenous liquid mixture without affecting the resultant coating. These solvents can include, for example, aromatic hydrocarbons such as benzene or toluene, alkanes such as n-heptane or dodecane, ketones, esters, glycol ethers, or cyclic dimethylpolysiloxanes, in an amount sufficient to dissolve/disperse the above materials to the concentration desired for application. Generally, enough of the above solvent is used to form a 0.1–80 weight percent mixture of the resins, preferably 1–50 wt. percent.

This mixture is then coated onto the substrate. The method of coating can be, but is not limited to, spin coating, dip coating, spray coating or flow coating. Other equivalent means, however, are also deemed to be within the scope of this invention.

The solvent is then allowed to evaporate from the coated substrate resulting in the deposition of the a coating. Any suitable means of evaporation may be used such as simple air drying by exposure to an ambient environment, by the application of a vacuum or mild heat (eg., less than 50° C.) or during the early stages of the heat treatment. It is to be noted that when spin coating is used, the additional drying period is minimized as the spinning drives off the solvent.

Although the above described methods primarily focus on using a liquid approach, one skilled in the art would recognize that other equivalent means would also function herein and are contemplated to be within the scope of this invention.

The coating is then typically converted to the ceramic by heating it to a sufficient temperature. Generally, the temperature is in the range of about 50 to about 1000° C. depending on the pyrolysis atmosphere. Preferred temperatures are in the range of about 50 to about 800° C. and more preferably 50°–500° C. Heating is generally conducted for a time sufficient to ceramify, generally up to about 6 hours, with less than about 3 hours being preferred.

The above heating may be conducted at any effective atmospheric pressure from vacuum to superatmospheric and under any effective oxidizing or non-oxidizing gaseous environment such as those comprising air, $O_2$, ozone, an inert gas ($N_2$, etc.), ammonia, amines, moisture, $N_2O$, $H_2$ etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods a ceramic coating is produced on the substrate. The thickness of the coating is generally greater than about 0.5 micrometers and often greater than 1 micrometer. These coatings smooth the irregular surfaces of various substrates, they are relatively defect free, and they have excellent adhesive properties. As such, they are particularly useful for a variety of electronic applications such as dielectric or protective layers and conductive layers.

Additional coatings may be applied over these coatings if desired. These can include, for example, $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings. Methods for the application of such coatings are known in the art and many are described in U.S. Pat. No. 4,756,977, which is incorporated herein by reference. An especially preferred coating is silicon carbide applied by the chemical vapor deposition of silacyclobutane or trimethylsilane. This process is described in U.S. Pat. No. 5,011,706 which is incorporated herein by reference.

The following non-limiting examples are included so that one skilled in the art may more readily understand the invention.

EXAMPLE 1

Hydrogen silsesquioxane resin, 0.9 g, produced by the method of Collins et al. in U.S. Pat. No. 3,615,272, 0.2 g of hydridopolysilazane (55.6 wt % solids in xylene) made by the method of Cannady in U.S. Pat. No. 4,540,803 and 60 ppm Pt (from 0.1 g Pt(AcAc)$_2$) were mixed in 8.8 g cyclic polydimethylsiloxanes. A 2.54 sq. cm silicon wafer was spin coated with this solution at 3000 rpm for 20 seconds. The coating was pyrolyzed for 3 hours at 400° C. in air. FTIR spectra of the coating showed that the coating was essentially converted to silica. The coating thickness was 0.5086 micrometers and the refractive index was 1.442 (8300 lambda).

EXAMPLE 2

Hydrogen silsesquioxane resin, 0.5 g, produced by the method of Collins et at. in U.S. Pat. No. 3,615,272, 1.0 g of hydridopolysilazane (55.6 wt % solids in xylene) made by the method of Cannady in U.S. Pat. No. 4,540,803, 3.0 g Of plasma alumina microballoons (6 micrometer) and 0.4 g glycidoxypropyltrimethoxysilane were mixed in 1 g cyclic polydimethylsiloxanes with a sonic probe to form a coating solution. An 11.25 sq. cm alumina panel was coated with the solution by using a 75 micrometer drawdown bar. The coated panel was air dried for 3 hours 25 minutes and pyrolyzed for 1 hour at 400° C. in air. The pyrolyzed coating was examined with a microscope and found to have no cracks at 1000×magnification. The coating thickness was 48.7 micrometers.

What is claimed is:

1. A method of forming a coating on an electronic substrate comprising:

applying a coating composition comprising between about 10 and about 90 wt. % hydrogen silsesquioxane resin and between about 90 and about 10 wt. % polysilazane onto an electronic substrate; and heating the coated substrate at a temperature sufficient to convert the coating composition into a ceramic coating.

2. The method of claim 1 wherein the coated substrate is heated at a temperature in the range of between about 50° C. and about 800° C.

3. The method of claim 1 wherein the coated substrate is heated in an environment Containing a gas selected from the group consisting of air, $O_2$, oxygen plasma, an inert gas, ammonia, amines, moisture, $H_2$ and $N_2O$.

4. The method of claim 1 wherein the coating composition also contains a platinum, rhodium or copper catalyst in an amount of between about 5 and about 500 ppm platinum, rhodium or copper based on the weight of hydrogen silsesquioxane resin and polysilazane.

5. The method of claim 1 wherein the coating composition also contains a filler.

6. The method of claim 5 wherein the coating composition also contains a material which modifies the surface of the filler for better adhesion.

7. The method of claim 5 wherein the filler is in a form selected from the group consisting of powders, particles, flakes, filaments and microballoons.

* * * * *